(12) United States Patent
Sato

(10) Patent No.: US 7,035,596 B2
(45) Date of Patent: Apr. 25, 2006

(54) MULTI-MODE CELLULAR PHONE TERMINAL

(75) Inventor: Yukio Sato, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 467 days.

(21) Appl. No.: 09/874,437

(22) Filed: Jun. 5, 2001

(65) Prior Publication Data

US 2001/0055980 A1    Dec. 27, 2001

(30) Foreign Application Priority Data

Jun. 6, 2000   (JP)   ............................. 2000-169390

(51) Int. Cl.
*H04B 1/40*   (2006.01)

(52) U.S. Cl. .................. 455/76; 455/552.1; 455/553.1; 455/562.1; 455/85; 455/86

(58) Field of Classification Search ............. 455/552.1, 455/552.2, 553.1, 41.2, 75, 422.1, 76, 260, 455/85, 86, 216, 522.1, 522.2, 562.1
See application file for complete search history.

(56) References Cited

U.S. PATENT DOCUMENTS

| 5,585,617 | A | * | 12/1996 | Ohbuchi et al. | ............ 235/491 |
| 5,668,837 | A |   | 9/1997  | Dent |  |
| 5,745,523 | A |   | 4/1998  | Dent et al. |  |
| 5,812,539 | A |   | 9/1998  | Dent |  |
| 6,516,201 | B1 | * | 2/2003 | Kanbara et al. | ............ 455/551 |

FOREIGN PATENT DOCUMENTS

| CN | 1185703 A | 6/1998 |
| CN | 1250985 A | 4/2000 |

* cited by examiner

*Primary Examiner*—Doris H. To
*Assistant Examiner*—Sanh Phu
(74) *Attorney, Agent, or Firm*—Pearne & Gordon LLP

(57) ABSTRACT

In such a multi-mode cellular phone terminal, a transmitter, a receiver and a synthesizer are composed of common hardware that can be used in a plurality of communications systems. A channel CODEC, a modulator, an equalizer and memory for signal processing programs are composed of common hardware to execute signal processing supporting a plurality of communications systems. A CPU and memory for a communications control program supports different communications control systems. Thus, it is provided a multi-mode cellular phone terminal that supports different communications systems with compact design and low cost.

12 Claims, 4 Drawing Sheets

MULTI-MODE CELLULAR PHONE TERMINAL

BACKGROUND OF THE INVENTION

The present invention relates to a multi-mode cellular phone terminal supporting a plurality of communications systems.

While cellular phone terminals supporting a variety of communications systems including the PDC (Personal Digital Cellular) system, CDMA (Code Division Multiple Access) system, and GSM (Global System for Mobile Communication) system, these communications systems are different in terms of communications procedure, signal processing details, frequency band and bit rate. To perform communications/conversation with such different cellular phone terminals, it is necessary to provide a cellular phone terminal supporting each communications system.

In the related art, in order to support a plurality of communications systems via a single terminal, hardware and software to support individual communications system have been provided and such hardware and software are accommodated in a single terminal. That is, in the related art, terminals supporting two communications systems are accommodated in a single cellular phone terminal for the user to select either of the terminals to support the communications systems in use.

A related art multi-mode cellular phone terminal supporting a plurality of communications systems houses hardware of two terminals. Thus, such a terminal has more parts and more necessary memory capacity than the single-mode cellular phone terminal. It is difficult to scale down the size of the terminal and accordingly, the cost is higher.

In recent years, a cellular phone terminal in greater need that allows voice calls as well as high-speed data communications via connection to the internet. In particular, a multi-mode cellular phone terminal is in need supporting a communications system for voice calls and a system for high-speed data communications, and featuring a compact design and low cost.

SUMMARY OF THE INVENTION

The present invention has been proposed in view of the aforementioned related art and aims at providing a compact-design and low-cost multi-mode cellular phone terminal supporting different communications systems.

A first aspect of the invention relates to a multi-mode cellular phone terminal comprising: radio communications means (transmitter 19, receiver 20, synthesizer 21) connected to an antenna for transmitting/receiving radio waves; signal processing means (memory for signal processing programs 4, signal processor 9) for transmitting/receiving a transmit/receive signal to/from the radio communications means; and communications control means (CPU 13, memory for a communications control program 17) for controlling the radio communications means and the signal processing means, the multi-mode cellular phone terminal supporting a plurality of communications systems, in that the radio communications means is composed of hardware to be used in common by a plurality of communications systems and that the signal processing means is composed of hardware to execute signal processing supporting a plurality of communications systems.

A second aspect of the invention relates to a multi-mode cellular phone terminal in that the signal processing means can support a plurality of different bit rates and modulation systems by using the same communications control system.

A third aspect of the invention relates to a multi-mode cellular phone terminal in that the communications control means can support different communications control systems and that the signal processing means can support different bit rates and modulation systems.

A fourth aspect of the invention relates to a multi-mode cellular phone terminal that the clock having a frequency necessary for modulation/demodulation at a plurality of different bit rates is generated by frequency division means (frequency divider 35) for making integral frequency division via different dividing number or fractional frequency division of a common reference clock output from a single oscillator.

A fifth aspect of the invention relates to a multi-mode cellular phone terminal in that the signal processing means executes modulation/demodulation supporting a plurality of communications systems and has a signal processor (signal processor 9) composed of common hardware and memory storing a plurality of signal processing programs (memory for signal memory for a communications control program 17).

A sixth aspect of the invention relates to a multi-mode cellular phone terminal in that the signal processing means has a signal processor (signal processor 9) composed of common hardware and read/write memory (memory 31) storing the minimum signal processing programs to support each communications system.

A seventh aspect of the invention relates to a multi-mode cellular phone terminal in that the communications control means has a controller (CPU 13) supporting a plurality of communications systems and memory (memory 17) storing control programs supporting the multi-mode.

An eighth aspect of the invention relates to a multi-mode cellular phone terminal in that the multi-mode cellular phone terminal has a system timer (system timer 27) for switching over a plurality of clocks generated by the frequency division means and counting different timings to support a plurality of communications systems.

A ninth aspect of the invention relates to a multi-mode cellular phone terminal in that the multi-mode cellular phone terminal establishes connection of a voice call or data communications by switching over and counting a plurality of timings to support a plurality of communications systems and maintaining the system timing synchronization supporting a plurality of communications systems.

A tenth aspect of the invention relates to a multi-mode cellular phone terminal in that the multi-mode cellular phone terminal performs a handover between different communications systems by providing monitoring means for monitoring the receiving state to support the communications system of the handover destination in the idle period of an established communications system in connecting a voice call or data communications and by maintaining the system timing synchronization to support the communications system of the handover destination.

According to the first aspect of the invention, it is possible to share hardware, reduce the number of parts, and implement an optimum terminal size.

According to the second aspect of the invention, it is possible to implement a multi-mode cellular phone terminal conforming to the GSM system (GMSK modulation) and EDGE system (8PSK modulation) by using the same communications control software and common hardware (LSI), thus implementing an optimum terminal size.

According to the third aspect of the invention, it is possible to implement a multi-mode cellular phone terminal conforming to the GSM system (GMSK modulation), EDGE system (8 PSK modulation) and IS136 system (QPSK modulation) by using communications control software supporting different communications control system and common hardware (LSI), thus implementing an optimum terminal size.

According to the fourth aspect of the invention, it is possible to implement a multi-mode cellular phone terminal by using a single oscillator, common hardware (LSI) and communications control software, thus implementing an optimum terminal size.

According to the fifth aspect of the invention, it is possible to implement a multi-mode cellular phone terminal by using a signal processor composed of common hardware (LSI) and communications control software, thus implementing an optimum terminal size.

According to the sixth aspect of the invention, it is possible to reduce the size of memory storing signal processing programs incorporated into common hardware, thus reducing the cost for common hardware.

According to the seventh aspect of the invention, it is possible to implement a multi-mode cellular phone terminal by using common hardware incorporating a signal processor and a controller and memory (communications control software) storing optimum control programs, thus implementing reduction of memory size via sharing and streamlining of programs.

According to the eighth aspect of the invention, it is possible to implement a terminal of an optimum size that can count different timings to support a plurality of communications systems by using a single oscillator and common hardware (LSI).

According to the ninth aspect of the invention, it is possible to implement a terminal of an optimum size that can establish connection of a voice call or data communications supporting an optimum communications system while maintaining the system timing synchronization supporting a plurality of communications systems, by using a single oscillator and communications control software.

According to the tenth aspect of the invention, it is possible to implement a terminal of an optimum size that can allows a handover between different communications systems while maintaining the system timing synchronization to support the communications system of the handover destination, by using a single oscillator, common hardware (LSI) and communications control software.

DETAILED DESCRIPTION OF THE PREFERRED EMBODIMENTS

Figure 1:
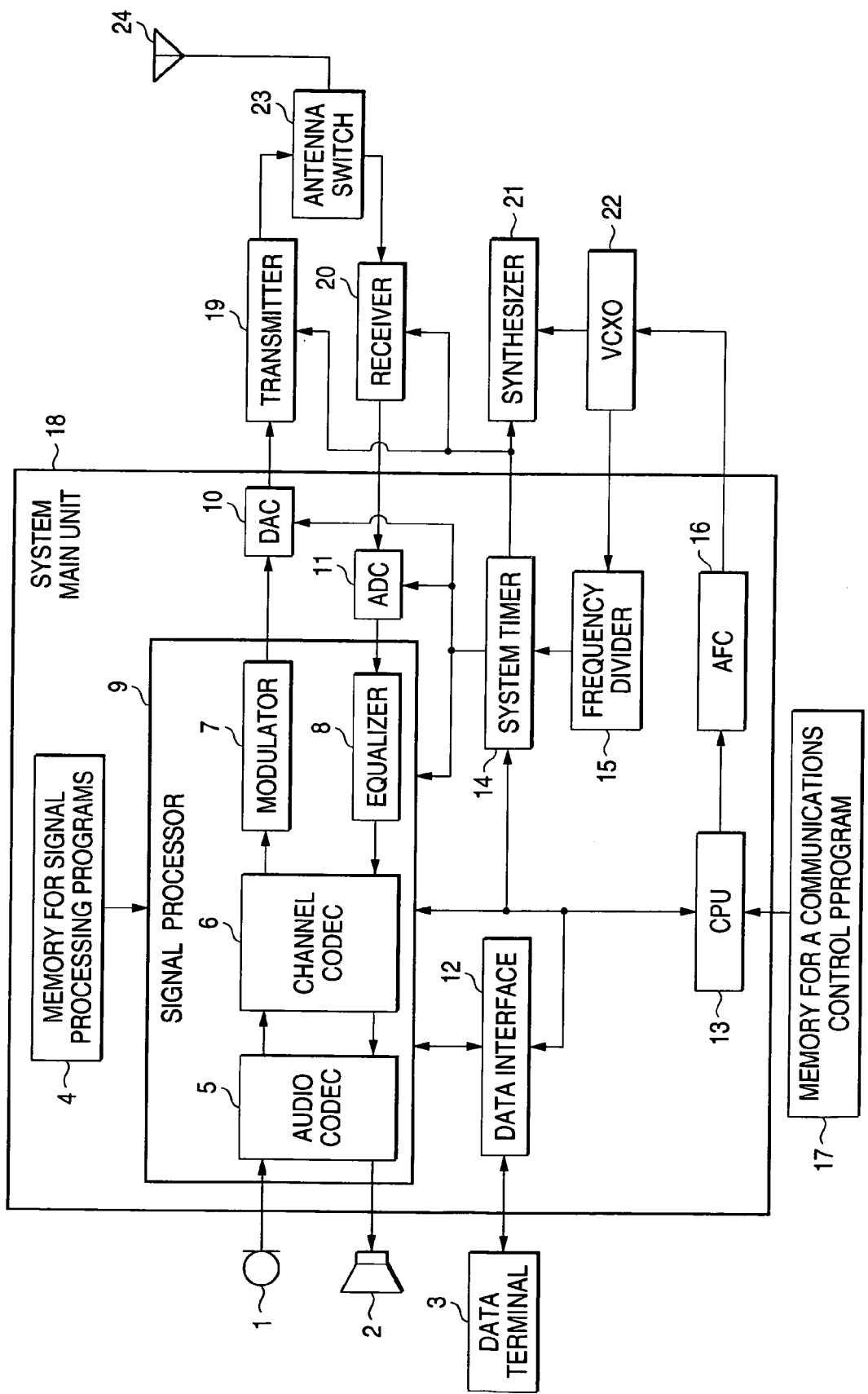
FIG. 1 is a block diagram of a multi-mode cellular phone terminal according to the first embodiment of the invention.

Embodiments of the invention will be described referring to the drawings.

First Embodiment

FIG. 1 is a block diagram of a multi-mode cellular phone terminal according to the first embodiment of the invention.

In FIG. 1, a transmitter 19, a receiver 20 and a synthesizer 21 compose radio communications means. A signal processor 9 having a channel CODEC 6, a modulator 7 and a equalizer 8 and memory 4 for signal processing programs compose signal processing means. A communications controller (CPU) 13 and memory for a communications control program 17 compose communications control means.

In more details, the multi-mode cellular phone terminal has a system main unit 18 manufactured as a baseband LSI to which a microphone 1 and an earpiece 2 for voice calls as well as the memory for a communications control program 17, the transmitter 19, the receiver 20, the synthesizer 21 and an oscillator (VCXO) 22. The transmitter 19 and the receiver 20 are connected to an antenna 24 via an antenna switch 23. Further, the system main unit 18 and an external data terminal 3 are connected via a connection port (not shown).

The system unit 18 is equipped with memory for signal processing programs 4 and a signal processor 9. The built-in memory 4 stores different signal processing programs. The signal processor 9 is composed of DSP (Digital Signal Processor) and operates as an audio CODEC 5 for compressing voice data taken from the microphone 1 or restoring a speech signal and outputting the resulting voice to the ear speaker 2, a channel CODEC 6 supporting different bit rates, a modulator 7 supporting different modulation systems and an equalizer (equipped with demodulation feature) 8 based on signal processing programs loaded from the memory 4.

The system main unit 18 further comprises a digital-to-analog converter (DAC) 10 for converting digital output from the modulator 7 to an analog signal and outputting the resulting signal to the transmitter 19, an analog-to-digital converter (ADC) 11 for converting an analog signal received from the receiver 20 to a digital converter and outputting the digital signal to the equalizer 8, a data input/output interface section (IF) 12, a CPU 13, a system timer 14, a frequency divider 15 and a frequency controller (AFC) 16.

The data interface 12 transmits/receives data to/from the external data terminal and transmits/receives data to/from the CPU 13. The CPU 13 reads a communications control program stored in the memory 17, executes operation processing according to the program to control the signal processor 2, the system timer 14, the data interface 12 and the AFC 16. The clock oscillator 22 controlled by the AFC 16 outputs a generated clock signal to the synthesizer 21 and the frequency divider 15. The clock signal frequency-divided by the frequency divider 15 is supplied to the system timer 14. The system timer 14 supplies a clock signal for operation to the synthesizer 21, the DAC 10, the ADC 11 and the signal processor 9.

The multi-mode cellular phone terminal thus configured processes voice calls via the GSM system (GMSK modulation) and data communications via the EDGE (Enhanced Data Rates for GSM Evolution) system (8 PSK modulation). While bit rate of the GMSK modulation differs from that of the 8 PSK modulation (270.8 kbps and 8.12.5 kbps), the communications control system is the same and the symbol rate (270.8 kSps), and the interface to the communications means (the transmitter 19, the receiver 20 and the synthesizer 21) is common.

A common system clock (13 MHz) is supplied to the system timer 14 via the frequency divider 15. Clocks supporting the common timing for GSM system and different bit rates (270.8 kbps and 812.5 kbps) and the common symbol rate (270.8 kSps) are supplied to the signal processor 9, the DAC 10, the ADC 11 and the radio communications means (the transmitter 19, the receiver 20, the synthesizer 21) respectively.

In the memory for signal processing programs 4 are stored read-only programs for executing signal processing in the channel CODEC 6 supporting different bit rates and the modulator 7 and the equalizer 8 supporting different modulation systems, GSMK modulation and 8PSK modulation.

In the memory for a communications control program 17 is stored a single optimum communications control program supporting the idle mode and voice communication mode of the GSM system (GMSK modulation) and the data communication mode of the EDGE system (8PSK modulation).

The operation of the multi-mode cellular phone terminal according to the first embodiment of the invention will be described. In the idle mode before establishing connection of a voice call or data communications, the communications control means (the CPU 13, the memory for a communications control program 17) loads the signal processing programs necessary for the idle mode of the GMSK modulation from the memory to the signal processor 9 (the channel CODEC 6, the modulator 7 and the equalizer 8) for signal processing programs 4 for execution. The communications control means controls the frequency of the clock oscillator 22 via the frequency controller 16 while receiving a control signal from a base station of the GSM system via the antenna 24, the antenna switch 23 and the receiver 20. The communications control means counts the system timing of the GSM system via the system timer 14 to maintain timing synchronization with the base station of the GSM system.

On entering the voice communication mode for connection of a voice call, the communications control means (the CPU 13, the memory for a communications control program 17) loads the signal processing programs necessary for the voice communication mode of the GMSK modulation from the memory for signal processing programs 4 to the signal processor 9 and transmits/receives voice data via a base station of the GSM system.

In the voice communication mode, voice data input from the microphone 1 is encoded to 13-kbps digital data via the audio CODEC 5 and input to the channel CODEC 6, and converted to 270.8-kbps data time-division-multiplexed via the channel CODEC 6 that is appropriate for the voice communication mode of the GSM system, then input to the modulator 7.

The modulator 7 performs GMSK modulation on the input 270.8-kbps data and outputs the resulting data to the transmitter 19. Via this, the 270.8-kbps modulated signal is transmitted from the antenna switch 23 and the antenna 24.

The GMSK-modulated speech signal received via the antenna 24, the antenna switch 23 and the receiver 20 is input to the equalizer 8 via the ADC 11. In the equalizer 8, the speech signal undergoes equalization and demodulation. The demodulated 270.8-kbps data is decoded to 13-kbps digital data via the channel CODEC 6 and restored (decoded) to human voice via the audio CODEC 5 and output from the earpiece 2.

On the other hand, on entering the data communication mode for connection of data communications, the communications control means (the CPU 13, the memory for a communications control program 17) loads the signal processing programs necessary for the EDGE system from the memory for signal processing programs 4. The communications control means then makes control so that signal processing by the channel CODEC 6, the modulator 7 and the equalizer 8 composing the signal processor 19 may be executed as the data communication mode of 8PSK modulation, and transmits/receives high-speed data via a base station supporting the EDGE system.

A data signal input from the data terminal 3 is input to the channel CODEC 6 as 48-kbps digital data via the data interface 12. In the channel CODEC 6, the data signal is time division-multiplexed to support the data communication mode of the EDGE system and converted to 812.5-kbps data and input to the modulator 7.

The modulator 7 performs 8PSK modulation on the input 812.5-kbps data. The 270.8-kSps modulated signal is converted to an analog signal via the DAC 10 and supplied to the transmitter 19, then transmitted via the antenna switch 23 and the antenna 24.

The 8PSK-modulated data signal received via the antenna 24, the antenna switch 23 and the receiver 20 is input to the equalizer 8 via the ADC 11. In the equalizer 8, the data signal undergoes equalization and demodulation. The demodulated 812.5-kbps data is decoded to 48-kbps digital data via the channel CODEC 6 and supplied to the data terminal 3 via the data interface 12.

As mentioned earlier, according to the first embodiment of the invention, the multi-mode cellular phone terminal using the same communications control system comprises hardware common to two communications systems, the hardware being a transmitter 19, a receiver 20 and a synthesizer 21 composing radio communications means, memory for signal processing programs 4 storing a plurality of signal processing programs supporting a plurality of different bit rates and modulation systems and a signal processor 9 composing signal processing means, memory for a communications control program 17 storing an optimally shared communications control program, a CPU 13 and a system timer 14 composing communications control means. Thus, it is possible to support the multi-mode for a voice call and high-speed data communications using different modulation systems. It is also possible to compose a system main unit 18 using a single LSI and provide shared communications control software. Via this, it is possible to implement a compact-design and low-cost portable terminal with small number of parts.

Second Embodiment

Figure 2:
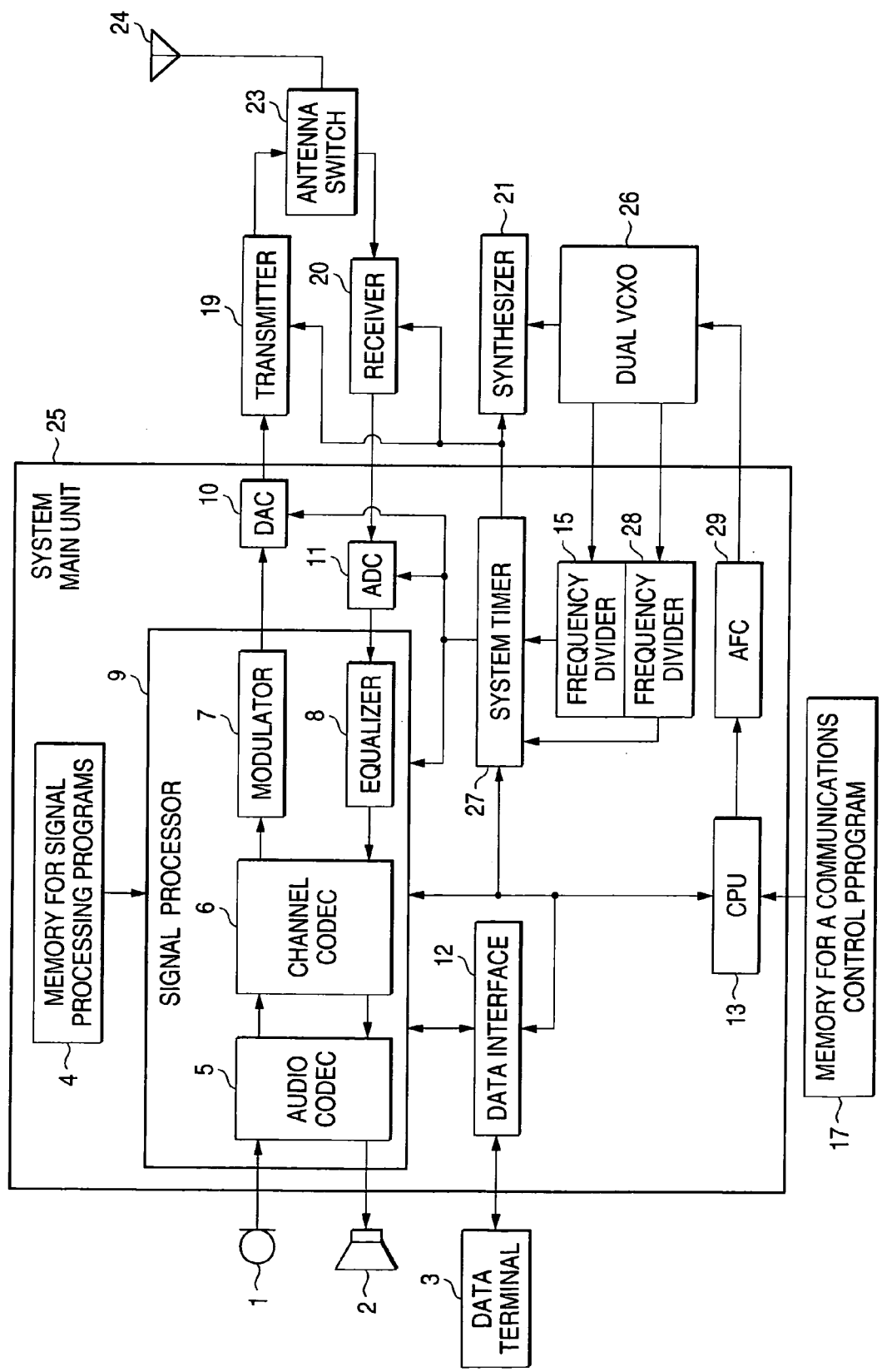
FIG. 2 is a block diagram of a multi-mode cellular phone terminal according to the second embodiment of the invention.

FIG. 2 is a block diagram of a multi-mode cellular phone terminal according to the second embodiment of the invention. The multi-mode cellular phone terminal according to the second embodiment processes data communications via the GSM system and voice calls via the IS136 system. The multi-mode cellular phone terminal in FIG. 2 differs from the multi-mode cellular phone terminal according to the first embodiment in FIG. 1 in that the clock oscillator support the dual mode and that two frequency dividers 15, 28 are provided to make frequency division of two clock outputs from the clock oscillator 26 respectively. Thus, a system timer 27 and an AFC 29 supports the modifications. In accordance with this, a system main unit 25 composed of an LSI has been modified.

In the second embodiment also, the transmitter 19, the receiver 20 and the synthesizer 21 form common radio communications means. The signal processor 9 composed of DSPs for executing signal processing such as the channel CODEC 6 supporting different bit rates, the modulator 7 supporting different modulation systems and the equalizer 8 including the feature of demodulator, and the memory for signal processing programs 4 form common signal processing means. The communications controller 13 composed of a CPU and the memory for a communications control program 17 storing a communications control program form common communications control means.

For the multi-mode cellular phone terminal according to the second embodiment, the bit rate of the GMSK modulation differs from that of the QPSK modulation (270.8 kbps and 48.6 kbps), and the symbol rate of the GMSK modulation differs from that of the QPSK modulation (270.8 kSps and 24.3 kSps). The interface to radio communications means (the transmitter 19, the receiver 20 and the synthesizer 21) is common.

System clocks having two clock frequencies (13 MHz, 19.44 MHz) output from the clock oscillator 26 are input to the system timer 37 via the frequency dividers 15, 28 respectively. The system timer 27 switches over the clock supporting the system timing and bit rate of the GSM system (270.8 kbps) and the clock supporting the system timing and bit rate of the IS136 system (48.6 kbps) and supplies either of the clocks to the signal processor 9, the DAC 10, the ADC 11 and the radio communications means (the transmitter 19, the receiver 20 and the synthesizer 21).

In the memory for signal processing programs 4 are stored read-only programs to execute a plurality of signal processes via the channel CODEC 6 supporting different bit rates, the modulator 7 supporting GMSK modulation and QPSK modulation and the equalizer including the demodulator feature.

In the memory for a communications control program 17 is stored a single optimum communications control program supporting the multi-mode that conforms to the idle mode and the data communication mode of the GSM system (GMSK modulation) and the idle mode and the voice communication mode of the IS136 system (QPSK modulation).

In the idle mode before establishing connection of data communications of the GSM system, the communications control means (the CPU 13, the memory for a communications control program 17) loads the signal processing programs necessary for the idle mode from the memory for signal processing programs 4 and makes control to perform signal processing via the channel CODEC 6, the modulator 7 and the equalizer composing the signal processor 19 as the idle mode of the GMSK modulation. The communications control means controls the frequency input to the frequency divider 15 from the clock oscillator 26 via the AFC 29 while receiving a control signal from a base station of the GSM system via the antenna 24, the antenna switch 23 and the receiver 20. The communications control means counts the system timing of the GSM system via the system timer 27 by using the system clock output from the frequency divider 15 to maintain timing synchronization with the base station of the GSM system.

On entering the data communication mode for connection of data communications, the communications control means (the CPU 13, the memory for a communications control program 17) loads the signal processing programs necessary for the GSM data communication mode of the GSM system from the memory for signal processing programs 4. The communications control means then makes control so that signal processing by the channel CODEC 6, the modulator 7 and the equalizer 8 composing the signal processor 19 may be executed as the data communication mode of GMSK modulation, and transmits/receives data via a base station supporting the GSM system.

A data signal input from the data terminal 3 is input to the channel CODEC 6 as 14.4-kbps digital data via the data interface 12. In the channel CODEC 6, the data signal is time-division-multiplexed to support the data communication mode of the GSM system and converted to 270.8-kbps data and input to the modulator 7.

The modulator 7 performs GMSK modulation on the input 270.8-kbps data. The 270.8-kSps modulated signal is converted to an analog signal via the DAC 10 and supplied to the transmitter 19, then transmitted via the antenna switch 23 and the antenna 24.

The GMSK-modulated data signal received via the antenna 24, the antenna switch 23 and the receiver 20 is input to the equalizer 8 via the ADC 11. In the equalizer 8, the data signal undergoes equalization and demodulation. The demodulated 270.8-kbps data is decoded to 14.4-kbps digital data via the channel CODEC 6 and output to the data terminal 3 via the data interface 12.

In the idle mode before establishing connection of a voice call of the IS136 system, the communications control means composed of the CPU 13 and the memory for a communications control program 17 loads the signal processing programs necessary for the idle mode from the memory for signal processing programs 4 and makes control to perform signal processing via the channel CODEC 6, the modulator 7 and the equalizer composing the signal processor 9 as the idle mode of the QPSK modulation. The communications control means controls the frequency input to the frequency divider 28 from the clock oscillator 26 via the AFC 29 while receiving a control signal from a base station of the IS136 system via the antenna 24, the antenna switch 23 and the receiver 20. The communications control means counts the system timing of the IS136 system via the system timer 27 to maintain timing synchronization with the base station of the IS136 system.

On entering the voice communication mode for connection of a voice call, the communications control means (the CPU 13, the memory for a communications control program 17) loads the signal processing programs necessary for the voice communication mode from the memory for signal processing programs 4. The communications control means then makes control so that signal processing by the channel CODEC 6, the modulator 7 and the equalizer 8 may be executed as the voice communication mode of QPSK modulation, and transmits/receives a voice call via a base station supporting the IS136 system.

Voice data input from the microphone 1 is encoded to 7.95-kbps digital data via the audio CODEC 5 and input to the channel CODEC 6, and converted to 48.6-kbps data time-division-multiplexed via the channel CODEC 6 that is appropriate for the voice communication mode of the IS136 system, then input to the modulator 7.

The modulator 7 performs QPSK modulation on the input 48.6-kbps data. The 24.3-kSps modulated signal is converted to an analog signal via the DAC 10 and supplied to the transmitter 19, then transmitted from the antenna switch 23 and the antenna 24.

The QPSK-modulated speech signal received via the antenna 24, the antenna switch 23 and the receiver 20 is input to the equalizer 8 via the ADC 11. In the equalizer 8, the speech signal undergoes equalization and demodulation. The demodulated 48.6-kbps data is decoded to 7.95-kbps digital data via the channel CODEC 6 and decoded to human voice via the audio CODEC 5 and output from the earpiece 2.

According to the second embodiment of the invention mentioned earlier, the multi-mode cellular phone terminal using different communications control systems comprises hardware common to two communications systems, the hardware being a transmitter 19, a receiver 20 and a synthesizer 21 composing radio communications means, memory for signal processing programs 4 storing a plurality of signal processing programs supporting a plurality of different bit rates and modulation systems and a signal processor 9 composing signal processing means, memory for a communications control program 17 storing an optimally shared communications control program, a CPU 13 and a system timer 27 supporting two system clocks of separate communications control systems, the CPU and the system timer composing communications control means. Thus, it is possible to provide a system main unit 25 composed of a common baseband LSI supporting the multi-mode for a voice call and data communications using different communications control systems and modulation systems, and communications control software where the size of memory for a communications control program 17 can be reduced via sharing and streamlining of programs. Via this, it is possible to implement an optimum terminal size and cost.

Third Embodiment

Figure 3:
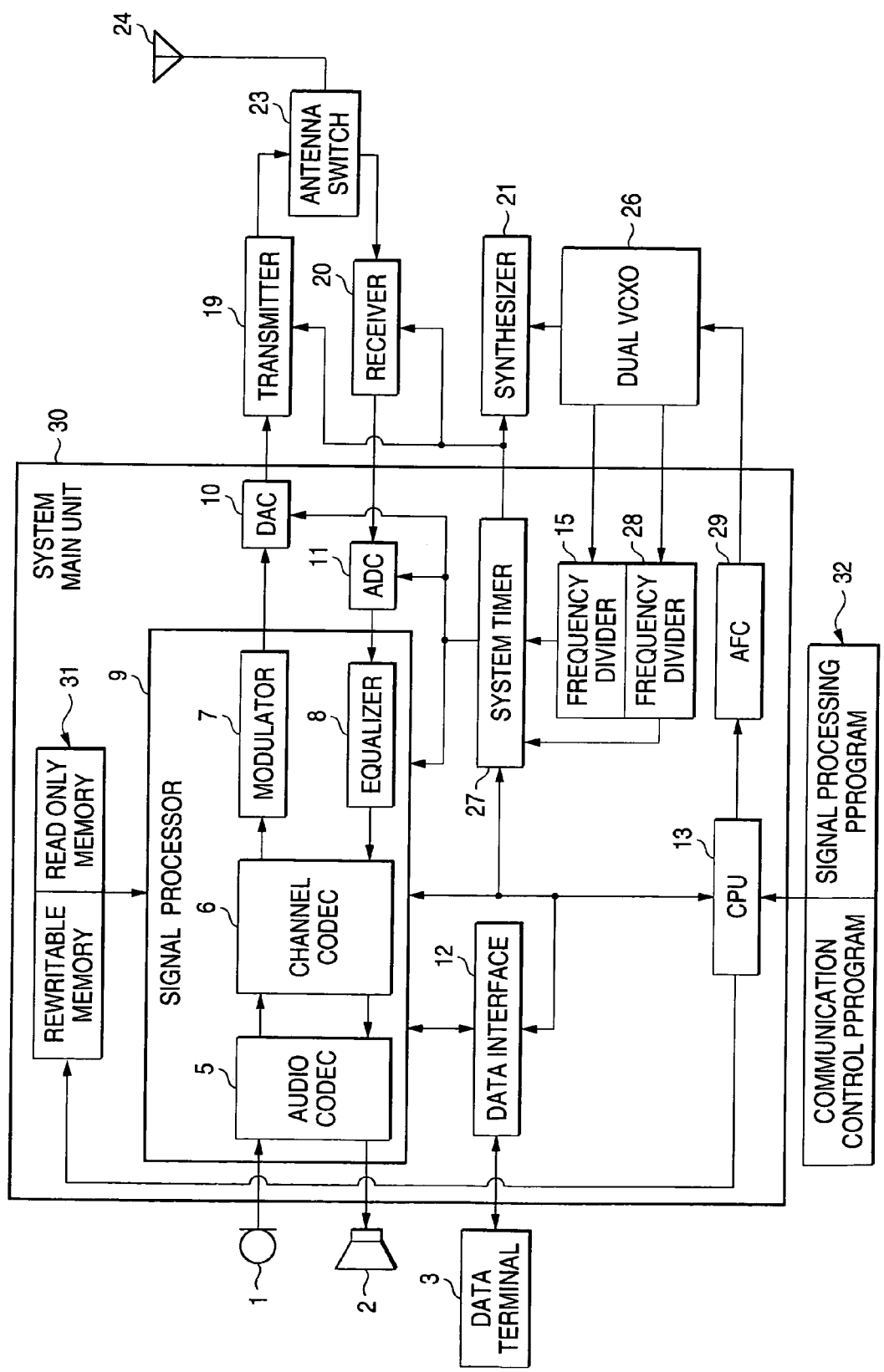
FIG. 3 is a block diagram of a multi-mode cellular phone terminal according to the third embodiment of the invention.

FIG. 3 is a block diagram of a multi-mode cellular phone terminal according to the third embodiment of the invention. The multi-mode cellular phone terminal according to the third embodiment processes data communications via the GSM system and voice calls via the IS136 system. The multi-mode cellular phone terminal in FIG. 3 differs from the multi-mode cellular phone terminal according to the second embodiment in FIG. 2 in that built-in memory 31 provided in a system main unit 30 composed of an LSI (corresponding to the memory for signal processing programs 4 in FIG. 2) has a read/write memory area and a read-only memory area, that the multi-mode cellular phone terminal stores a communications control program and signal processing programs in external memory 32 (corresponding to the memory 17 in FIG. 2), and that the CPU 13 can download signal processing programs to the built-in memory 31.

In the multi-mode cellular phone terminal according to the third embodiment, the transmitter 19, the receiver 20 and the synthesizer 21 form common radio communications means. The signal processor 9 composed of DSPs for executing signal processing such as the channel CODEC 6 supporting different bit rates, the modulator 7 supporting different modulation systems and the equalizer 8 including the feature of demodulator, and the memory 13 storing read-only signal processing programs and read/write signal processing programs form common signal processing means. The communications controller 13 composed of a CPU and the memory 32 storing signal processing programs from which a communications control program can be downloaded to memory 31 form common communications control means.

For the multi-mode cellular phone terminal according to the third embodiment, the bit rate of the GMSK modulation differs from that of the QPSK modulation (270.8 kbps and 48.6 kbps), and the symbol rate of the GMSK modulation differs from that of the QPSK modulation (270.8 kSps and 24.3 kSps). The interface to radio communications means (the transmitter 19, the receiver 20 and the synthesizer 21) is common.

Two types of system clocks having two clock frequencies (13 MHz, 19.44 MHz) output from the clock oscillator 26 are input to the system timer 27 via the frequency dividers 15, 28 respectively. The system timer 27 switches over the clock supporting the system timing and bit rate of the GSM system (270.8 kbps) and the clock supporting the system timing and bit rate of the IS136 system (48.6 kbps) and supplies either of the clocks to the signal processor 9, the DAC 10, the ADC 11 and the radio communications means (the transmitter 19, the receiver 20 and the synthesizer 21).

In the memory 31, unlike the first and second embodiments, signal processing programs are not permanently stored. Instead, the mandatory signal processing programs having a large program size used by the audio CODEC 5 and the equalizer 8 are stored in the read-only memory area.

In the external memory 32 is stored a single optimum communications control program supporting the multi-mode that conforms to the idle mode and the data communication mode of the GSM system (GMSK modulation) and the idle mode and the voice communication mode of the IS136 system (QPSK modulation). Also, in the memory 32 are store signal processing programs used by the channel CODEC 6 and the modulator 7 of the GSM system and the IS136 system to be downloaded to the read/write area of the memory 31.

In the idle mode before establishing connection of data communications of the GSM system, the communications control means composed of the CPU 13, the memory for a communications control program 17 reads the signal processing programs used by the signal processor 9 to execute signal processing via the modulator 7 and the equalizer 8 as the idle mode of GMSK modulation, transfers the programs to the read/write area of the memory 31 for execution via the signal processor. The communications control means controls the frequency input to the frequency divider 15 from the clock oscillator 26 via the AFC 29 while receiving a control signal from a base station of the GSM system via the antenna 24, the antenna switch 23 and the receiver 20. The communications control means counts the system timing of the GSM system via the system timer 27 by using the system clock output from the frequency divider 15 to maintain timing synchronization with the base station of the GSM system.

On entering the data communication mode for connection of data communications, the communications control means (the CPU 13, the memory 32) downloads the signal processing programs used by the channel CODEC 6 alone that are necessary for the data communication mode of the GSM system among the signal processing programs used by the signal processor to execute signal processing via the channel CODEC 6, the modulator 7 and the equalizer 8 as the data communication mode of GMSK modulation, from the memory 32 to overwrite the signal processing programs in the memory 31. The signal processor 9 executes signal processing programs stored in both of the read/write area and the read-only area to perform data transmission/reception via a base station of the GSM system.

A data signal input from the data terminal 3 is input to the channel CODEC 6 as 14.4-kbps digital data via the data interface 12. In the channel CODEC 6, the data signal is time-division-multiplexed to support the data communication mode of the GSM system and converted to 270.8-kbps data and input to the modulator 7.

The modulator 7 performs GMSK modulation on the input 270.8-kbps data. The 270.8-kSps modulated signal is converted to an analog signal via the DAC 10 and supplied to the transmitter 19, then transmitted via the antenna switch 23 and the antenna 24.

The GMSK-modulated data signal received via the antenna 24, the antenna switch 23 and the receiver 20 is input to the equalizer 8 via the ADC 11. In the equalizer 8, the data signal undergoes equalization and demodulation. The demodulated 270.8-kbps data is decoded to 14.4-kbps digital data via the channel CODEC 6 and output to the data terminal 3 via the data interface 12.

In the idle mode before establishing connection of a voice call of the IS136 system, the communications control means (the CPU 13, the memory 32) downloads the signal processing programs used by the channel CODEC 6 and the modulator 7 alone that are necessary for the idle mode of the IS136 system in order to execute signal processing via the channel CODEC 6, the modulator 7 and the equalizer 8 as the idle mode of QPSK modulation, from the memory 32 to the memory 31, then reads the signal processing programs required by the signal processor 9 in the idle mode alone from the memory for signal processing programs 31. As mentioned earlier, the communications control means controls the frequency input to the frequency divider 28 from the clock oscillator 26 via the AFC 29 while receiving a control signal from a base station of the IS136 system. The communications control means counts the system timing of the IS136 system via the system timer 27 by using the system clock output from the frequency divider 28 to maintain timing synchronization with the base station of the IS136 system.

On entering the voice communication mode for connection of a voice call, the communications control means (the CPU 13, the memory 32) downloads the signal processing programs used by the channel CODEC 6 alone that are necessary for the voice communication mode of the IS136 system used by the signal processor to execute signal processing via the channel CODEC 6, the modulator 7 and the equalizer 8 as the voice communication mode of QPSK modulation, from the memory 32 to overwrite the signal processing programs in the memory 31. The communications control means then reads the signal processing means necessary in the voice communication mode alone from the memory for signal processing programs and executes the programs to perform voice data transmission/reception via a base station of the IS136 system.

Vice data input from the microphone 1 is encoded to 7.95-kbps digital data via the audio CODEC 5 and input to the channel CODEC 6, and converted to 48.6-kbps data time-division-multiplexed via the channel CODEC 6 that is appropriate for the voice communication mode of the IS136 system, then input to the modulator 7.

The modulator 7 performs QPSK modulation on the input 48.6-kbps data. The 24.3-kSps modulated signal is converted to an analog signal via the DAC 10 and supplied to the transmitter 19, then transmitted from the antenna switch 23 and the antenna 24.

The QPSK-modulated speech signal received via the antenna 24, the antenna switch 23 and the receiver 20 is input to the equalizer 8 via the ADC 11. In the equalizer 8, the speech signal undergoes equalization and demodulation. The demodulated 48.6-kbps data is decoded to 7.95-kbps digital data via the channel CODEC 6 and decoded to human voice via the audio CODEC 5 and output from the earpiece 2.

According to the third embodiment of the invention, the multi-mode cellular phone terminal using different communications control systems comprises hardware common to two communications systems, the hardware being a transmitter 19, a receiver 20 and a synthesizer 21 composing signal processing means, memory for signal processing programs 31 storing the minimum signal processing programs necessary for supporting a plurality of different bit rates and modulation systems and a signal processor 9 composing signal processing means, the memory 32 storing signal processing programs from which an optimally shared communications control program can be downloaded to memory 31, a CPU 13 and a system timer 27 supporting two system clocks of different communications control systems composing communications control means. Thus, it is possible to provide a system main unit 30 composed of a common baseband LSI where the size of memory 31 can be reduced, supporting the multi-mode for a voice call and data communications using different communications control systems and modulation systems, and shared and streamlined communications control software. Via this, it is possible to implement an optimum terminal size and cost.

Fourth Embodiment

Figure 4:
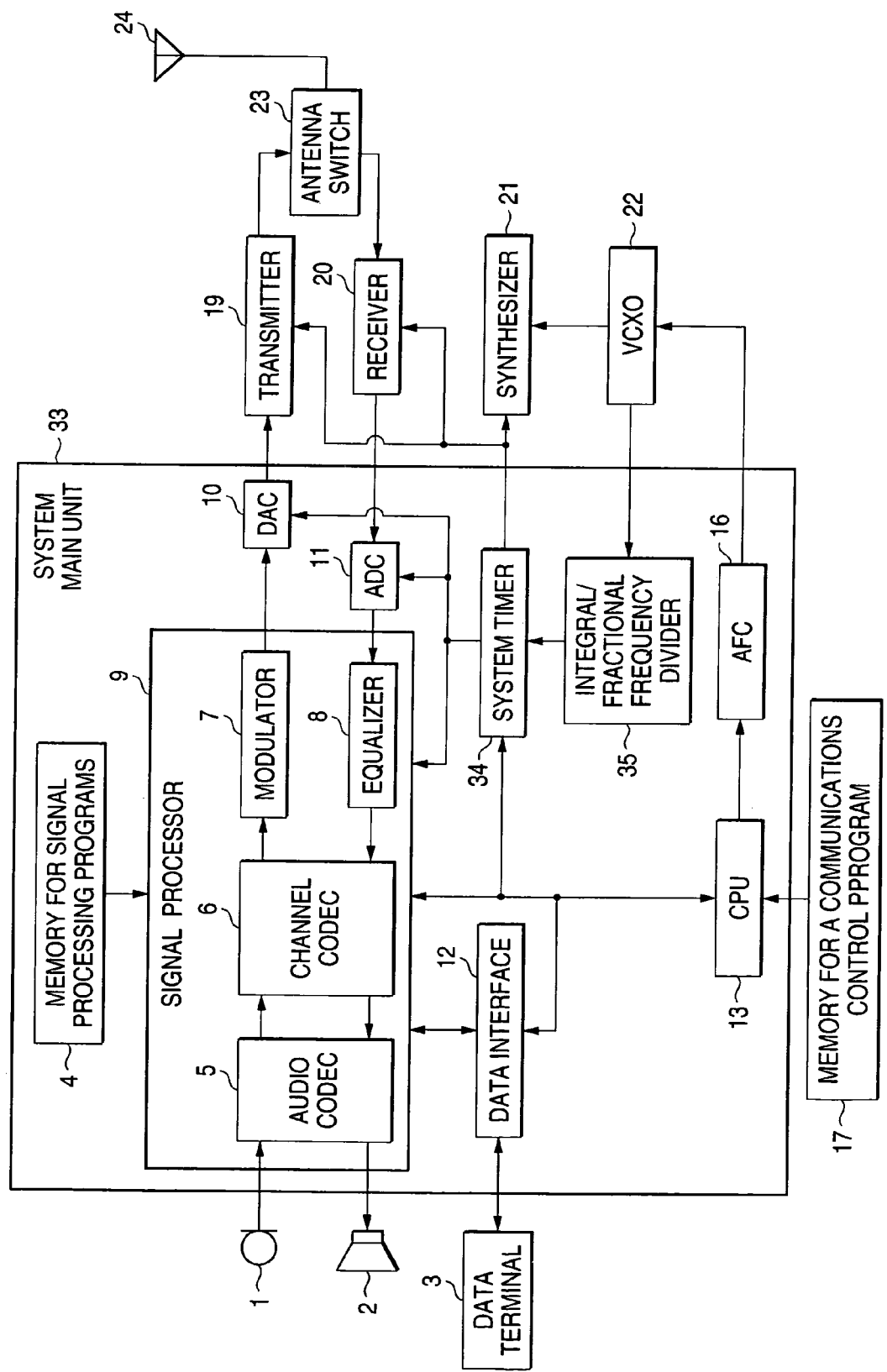
FIG. 4 is a block diagram of a multi-mode cellular phone terminal according to the fourth embodiment of the invention.

FIG. 4 is a block diagram of a multi-mode cellular phone terminal according to the fourth embodiment of the invention. The multi-mode cellular phone terminal according to the fourth embodiment processes data communications via the GSM system and voice calls via the IS136 system. The multi-mode cellular phone terminal in FIG. 4 differs from the multi-mode cellular phone terminal according to the second embodiment in FIG. 2 in that a frequency divider 35 provided in a system main unit 33 is capable of making integral frequency division and fractional frequency division and that a clock oscillator provided outside the system main unit 33 is not a dual type but a single type.

Basic operation of a multi-mode cellular phone terminal according to the fourth embodiment is similar to that in the second embodiment, so that detailed description will be omitted. For the multi-mode cellular phone terminal supporting different modulation systems in the GSM system and the IS136 system, the bit rate of the GMSK modulation differs from that of the QPSK modulation (270.8 kbps and 48.6 kbps), and the symbol rate of the GMSK modulation differs from that of the QPSK modulation (270.8 kSps and 24.3 kSps). The interface to radio communications means (the transmitter 19, the receiver 20 and the synthesizer 21) is common.

System clocks having a clock frequency of 13 MHz output from the clock oscillator 22 undergoes integral frequency division or fractional frequency division via the frequency divider 35 to generate a clock (48-based frequency division) supporting the system timing and bit rate of the GSM system (270.8 kbps) and a clock (65000/243-based frequency division) supporting the system timing and bit rate of the IS136 system (48.6 kbps). The system timer 34 switches over these clocks and supplies either of the clocks to the signal processor 9, the DAC 10, the ADC 11 and the radio communications means (the transmitter 19, the receiver 20 and the synthesizer 21).

By using the frequency divider that makes integral frequency division and fractional frequency division, it is possible to generate two system clocks supporting different communications control systems out of a clock signal output from a single common reference clock oscillator 22, thus implementing an optimum terminal size and cost.

In the second through embodiments of the invention, it is possible to perform a handover between different communications systems by providing monitoring means for monitoring the receiving state to support the communications system of the handover destination in the idle period of an established communications system in connecting a voice call or data communications and by selecting and maintaining the system timing synchronization to support the communications system of the handover destination.

According to the invention, it is possible to provide common hardware (LSI) supporting a plurality of bit rates and modulation systems and shared communications control software, thus implementing an optimum terminal size and cost.

What is claimed is:

1. A multi-mode cellular phone terminal comprising:
   radio communications means connected to an antenna for transmitting/receiving radio waves;
   signal processing means for transmitting/receiving a transmit/receive signal to/from said radio communication means; and
   communications control means for controlling said radio communications means and said signal processing means, said multi-mode cellular phone terminal supporting a plurality of communications systems,
   wherein said radio communications means is composed of hardware to be use in common by a plurality of communications systems, and said signal processing means is composed of hardware to execute signal processing supporting the plurality of communications systems,
   wherein said signal processing means can support different bit rates and modulation systems, and
   wherein connection of a voice or data communication is established by switching over and counting a plurality of timings to support the plurality of communications systems and maintaining the system timing synchronization supporting the plurality of communications systems.

2. A multi-mode cellular phone terminal according to claim 1, wherein a clock having a frequency necessary for modulation/demodulation at a plurality of different bit rates is generated by frequency division means for making integral frequency division via different dividing number or fractional frequency division of a common reference clock output from a single oscillator.

3. A multi-mode cellular phone terminal according to claim 1, wherein said signal processing means executes modulation/demodulation supporting a plurality of communications systems and has a signal processor composed of common hardware and memory storing a plurality of signal processing programs.

4. A multi-mode cellular phone terminal according to claim 1, wherein said signal processing means has a signal processor composed of common hardware and read/write memory storing the minimum signal processing programs to support each communications system.

5. A multi-mode cellular phone terminal according to claim 1, wherein said communications control means has a controller supporting a plurality of communications systems and memory storing control programs supporting the multi-mode.

6. A multi-mode cellular phone terminal according to claim 2, wherein said multi-mode cellular phone terminal has a system timer for switching over a plurality of clocks generated by said frequency division means and counting different timings to support a plurality of communications systems.

7. A multi-mode cellular phone terminal comprising
   radio communications means connected to an antenna for transmitting/receiving radio waves;
   signal processing means for transmitting/receiving a transmit/receive signal to/from said radio communication means; and
   communications control means for controlling said radio communications means and said signal processing means, said multi-mode cellular phone terminal supporting a plurality of communications systems,
   wherein said radio communications means is composed of hardware to be use in common by a plurality of communications systems, and said signal processing means is composed of hardware to execute signal processing supporting a plurality of communications systems,
   wherein communications control means can support different communications control systems and that said signal processing means can support different bit rates and modulation systems,
   wherein said communications control means has a controller supporting a plurality of communications systems and memory storing control programs supporting the multi-mode, and
   wherein said multi-mode cellular phone terminal establishes connection of a voice call or data communications by switching over and counting a plurality of timings to support a plurality of communications systems and maintaining the system timing synchronization supporting a plurality of communications systems.

8. A multi-mode cellular phone terminal comprising
   radio communications means connected to an antenna for transmitting/receiving radio waves;
   signal processing means for transmitting/receiving a transmit/receive signal to/from said radio communication means; and
   communications control means for controlling said radio communications means and said signal processing means, said multi-mode cellular phone terminal supporting a plurality of communications systems,
   wherein said radio communications means is composed of hardware to be use in common by a plurality of communications systems, and said signal processing means is composed of hardware to execute signal processing supporting a plurality of communications systems,
   wherein communications control means can support different communications control systems and that said signal processing means can support different bit rates and modulation systems,
   wherein said multi-mode cellular phone terminal has a system timer for switching over a plurality of clocks generated by said frequency division means and counting different timings to support a plurality of communications systems, and
   wherein said multi-mode cellular phone terminal establishes connection of a voice call or data communications by switching over and counting a plurality of timings to support a plurality of communications systems and maintaining the system timing synchronization supporting a plurality of communications systems.

9. A multi-mode cellular phone terminal comprising
   radio communications means connected to an antenna for transmitting/receiving radio waves;

signal processing means for transmitting/receiving a transmit/receive signal to/from said radio communication means; and communications control means for controlling said radio communications means and said signal processing means, said multi-mode cellular phone terminal supporting a plurality of communications systems, wherein said radio communications means is composed of hardware to be use in common by a plurality of communications systems, and said signal processing means is composed of hardware to execute signal processing supporting a plurality of communications systems, wherein communications control means can support different communications control systems and that said signal processing means can support different bit rates and modulation systems, wherein a clock having a frequency necessary for modulation/demodulation at a plurality of different bit rates is generated by frequency division means for making integral frequency division via different dividing number or fractional frequency division of a common reference clock output from a single oscillator, and wherein said multi-mode cellular phone terminal establishes connection of a voice call or data communications by switching over and counting a plurality of timings to support a plurality of communications systems and maintaining the system timing synchronization supporting a plurality of communications systems.

10. A multi-mode cellular phone terminal according to claim 7, characterized in that said multi-mode cellular phone terminal performs a handover between different communications systems by providing monitoring means for monitoring the receiving state to support the communications system of the handover destination in the idle period of an established communications system in connecting a voice call or data communications and by maintaining the system timing synchronization to support the communications system of the handover destination.

11. A multi-mode cellular phone terminal according to claim 8, characterized in that said multi-mode cellular phone terminal performs a handover between different communications systems by providing monitoring means for monitoring the receiving state to support the communications system of the handover destination in the idle period of an established communications system in connecting a voice call or data communications and by maintaining the system timing synchronization to support the communications system of the handover destination.

12. A multi-mode cellular phone terminal according to claim 9, characterized in that said multi-mode cellular phone terminal performs a handover between different communications systems by providing monitoring means for monitoring the receiving state to support the communications system of the handover destination in the idle period of an established communications system in connecting a voice call or data communications and by maintaining the system timing synchronization to support the communications system of the handover destination.

* * * * *